United States Patent [19]
Edmonds

[11] 3,806,777

[45] Apr. 23, 1974

[54] VISUAL OPTIMIZATION OF LIGHT EMITTING DIODES

[75] Inventor: Harold Donald Edmonds, Hopewell Junction, N.Y.

[73] Assignee: International Business Machines Corporation, Armonk, N.Y.

[22] Filed: July 3, 1972

[21] Appl. No.: 268,341

[52] U.S. Cl.... 317/235 R, 317/235 N, 317/235 NA

[51] Int. Cl. .......... H01l 15/00

[58] Field of Search .......... 317/235

[56] References Cited

UNITED STATES PATENTS 3,611,064 10/1971 Hall et al. .......... 317/234

3,534,231 10/1970 Biard .......... 317/235

*Primary Examiner*—Rudolph V. Rolinec
*Assistant Examiner*—E. Wojciechowicz
*Attorney, Agent, or Firm*—Daniel E. Igo

[57] ABSTRACT

Disclosed is a multiplicity of discrete electrically interconnected light emitting diodes which produce light within the visible range of the spectrum and interconnected in such a manner so as to exhibit maximum uniform current density and brightness arranged in such proximity so that each said discrete light emitting diode is not discernible to the human eye.

5 Claims, 3 Drawing Figures

VISUAL OPTIMIZATION OF LIGHT EMITTING DIODES

BACKGROUND OF THE INVENTION

1. Field of the Invention

This invention relates to light emitting diodes and more particularly to diodes which emit light within the visible area of the spectrum. Diodes of this type are generally made by providing a semiconductor substrate in which a PN junction is formed by introducing an impurity into the semiconductor substrate. Junctions of this type are usually formed by conventional diffusion, ion implantation or other methods which enable one to incorporate impurities or dopants into the semiconductor substrate in a manner to form sharp boundaries between the impurity and the substrate material thereby producing what is referred to as a PN junction. The PN junction being the incorporation of an impurity of one conductivity type into a semiconductor material having an opposite conductivity.

When an electron in a semiconductor undergoes a transition to a lower energy state, the energy it loses may be emitted as a photon. The wavelength of the emitted photon is related to the energy lost by the electron. Conventionally, the term "light" refers to those photons which are in a wavelength range detectable by the human eye. The wavelength of the light is determined by its energy transition. It can be controlled to a degree by controlling the type of light emission mechanism. For example, the most efficient known form of light emission is radiative recombination of holes and electrons in a direct band gap semiconductor when it is forward biased. The wavelength of this narrow band emission is uniquely related to the band gap energy of the semiconductor from which it is emitted. Therefore, it can be controlled by changing the band gap energy. Variation of semiconductor material, composition, external magnetic fields, ambient temperature, mechanical stress and the like, have been used to vary the band gap and hence control the wavelength of the light emission.

Light emitting diodes which emit light within the visible area of the spectrum require a material that has a wide energy band gap capable of radiative recombination in the visible part of the spectrum. This is commonly accomplished by using a material such as gallium arsenide phosphide which can be adjusted or tailored to different wavelengths by changing the amount of phosphorous in the gallium, arsenic and phosphorous elemental composition arrangement. The gallium arsenide phosphide is usually epitaxially grown on the substrate of gallium arsenide wherein a transition or graded layer is utilized to alleviate the distortion that accompanies such growth due to the difference in crystal lattice match between gallium arsenide and gallium phosphide. The PN junction is usually formed by the diffusion of acceptor states for example, zinc, into the gallium arsenide phosphide. These junctions can be grown or planar diffused using standard photolithographic techniques. The light emitting diode is formed when suitable contacts are applied to the P and the N sides of the junction, and forward biased by a suitable voltage. Visible light emission is observed due to radiative recombination of injected electrons when the device is biased in this manner with the appropriate voltage.

Device diodes formed in this or any other matter are capable of being used as indicator lights on panels, numeric readouts, information display panels through the use of an array of junctions in a dot matrix form so that any alphanumeric character can be portrayed, and the like.

The light emitting diodes referred to above are capable of being operated in a dc or an ac mode, depending on the particular application of the device. One of the most important parameters in the operation of such devices is the external quantum efficiency. This is a measure of how the input electrical power is converted into optical power or light output.

2. Description of the Prior Art

U. S. Pat. No. 3,508,111 discloses a PN junction light source having spatial control of the emitted light from a semiconductor material having at least one PN junction. Also taught in the above-identified patent, are means to allow a localized bias across at least certain portions of the PN junction to cause light emission at the desired portion of the junction. An isolating substrate junction may be used to form a lower portion of the light source which is below the PN junction. Similarly, a means is taught for adjusting the lateral current between the substrate junction and the PN junction to control the light emission area along the PN junction.

It has been advanced that less average pulse current is required to achieve equal brightness produced by direct current in a gallium arsenide phosphide light emitting diode. The enhancement in perceived brightness for pulse light emitting diodes has been attributed to persistance of vision. This enhancement is believed to be negligible when the duty factor is increased to about 20 percent.

SUMMARY OF THE INVENTION

It is an object of this invention to provide a light emitting diode structure having significantly improved external efficiency.

It is another object of this invention to provide a light emitting diode within the visible area of the spectrum having significantly improved light emission characteristics.

It is still a further object of this invention to provide a light emitting diode device having a significantly improved external quantum efficiency relative to a PN junction area with comparable boundaries.

The foregoing and other objects are accomplished by providing a light emitting device of a given area having interconnected discrete light sources wherein current contact area to the P and N segments of the junction is peripheral.

DESCRIPTION OF THE PREFERRED EMBODIMENTS

Figure 1:
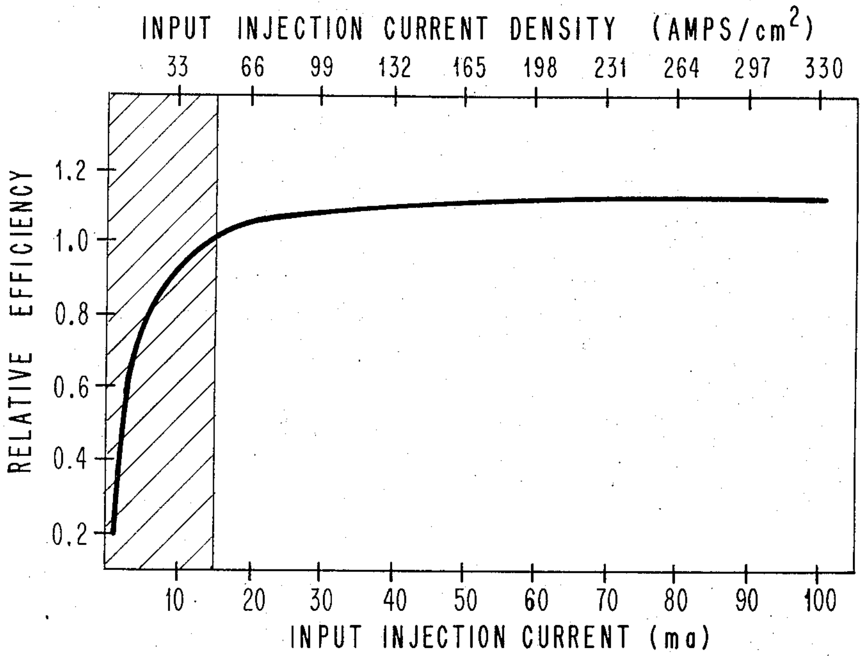
FIG. 1 is a plot of the relative external efficiency versus the injection current density and the input injection current in amps per centimeter squared and milliamps, respectively, for a gallium arsenide phosphide semiconductor material and a zinc diffused dopant forming the PN junction of a light emitting diode.

The external quantum efficiency of a light emitting diode is a measure of the ability of the device to convert electrical energy into optical energy. FIG. 1 illustrates a typical plot of external quantum efficiency for a gallium arsenide phosphide ($GaAs_{1-x}P_2$) semiconductor visible light emitting diode as a function of injection current and current density. In addition to gallium arsenide phosphide, such materials as gallium aluminum arsenide, aluminum arsenide, aluminum phosphide, aluminum nitride, gallium nitride, gallium phosphide, and the like, are suitable semiconductor substrates useful for making light emitting PN junctions. The injection current for a small light emitting area is generally in the order of a few milliamps. In a device illustrated in FIGS. 2 and 3 of the drawing, it has been found that the injection current is in the order of 0.5 milliamps. The current density is a meaningful term for describing the current required to drive a light emitting diode because it also implies the area of the device. By definition, current density J is represented by the expression $J = I/A$ where $I$ is the input injection current in amps and $A$ is the area of the device expressed usually in square centimeters. Therefore, at approximately 1 milliamp of injection into a device with an active area of $3 \times 10^{-4}$ square centimeters, the current density is equal to 3.3 amps per square centimeter. Utilizing the plot of FIG. 1 as a guide, the device area can be changed in order to maximize the efficiency, e.g., by decreasing the device area, the current density is increased and the external quantum efficiency is correspondingly increased. The shaded region in the plot of FIG. 1 illustrates the maximum gain to be realized in a gallium arsenide phosphide semiconductor light emitting diode device.

It can readily be seen for a device as illustrated by the curve of FIG. 1, where the area is $3 \times 10^{-4}$ square centimeters, and if the operating current range is between 0.5 and 2 milliamps, the device is being operated at the lowest part of the efficiency curve. Consequently, in accordance with the concept of the present invention, by dividing up the light emitting area of a specified device into discrete PN junctions, the area for a specific light emitting area is significantly reduced which allows the device to operate at a much greater efficiency and in many instances has as much as a factor of 10, depending upon the current level and actual design of the discrete structure and its geometry. A typical illustration for segmenting or dividing up a light emitting diode area or structure is shown in FIG. 3. This is a common light emitting diode design for a single element which could be utilized in a typical 5 × 7 array used in an application for alphanumeric readout. While FIG. 2 is the prior art element and illustrates the conventional way of utilizing a light emitting PN junction area wherein the current contacts are positioned across the doped or impurity containing area.

FIG. 1 illustrates by the shaded area that segment of the plot of input injection current or current density relative to external efficiency wherein maximum benefit is obtainable. It is well known that semiconductor light emitting diodes produce maximum light at the point of maximum current density. Consequently, a device as illustrated in FIG. 2 having a gallium arsenide phosphide substrate 2 on a gallium arsenide base 3 and PN junction area 4 upon which conventional metal contact strips 5 traverse the junction impurity or dopant area is materially defective because the area of maximum current density is beneath the contact metallurgy 5 which interrupts the light emission.

Figure 2:
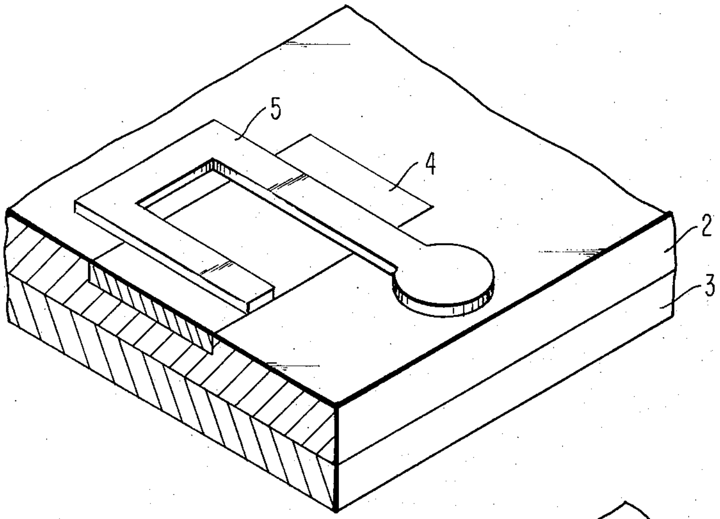
FIG. 2 PRIOR ART
FIG. 2 is a fragmentary sectional perspective view illustrating prior art light emitting diode diffusion in gallium arsenide phosphide substrate.
Figure 3:
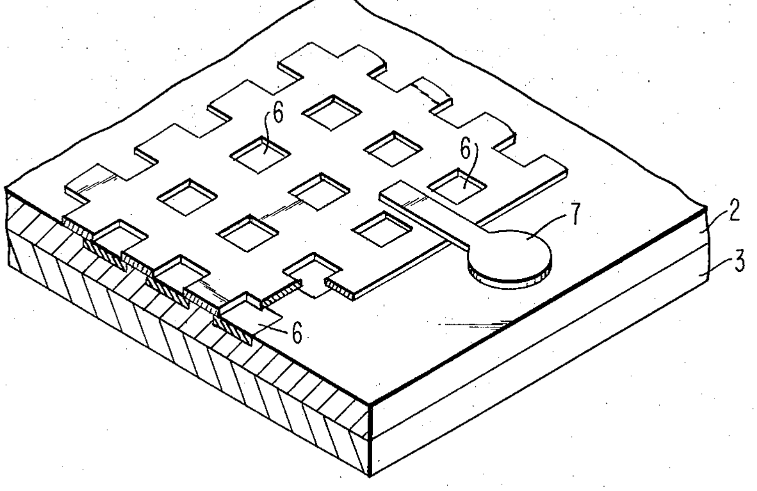
FIG. 3 is a fragmentary sectional perspective view illustrating an embodiment of the instant invention and showing discrete interconnected light emitting diodes in a gallium arsenide phosphide substrate.

FIG. 3 illustrates a similar semiconductor material wherein the overall junction or dopant boundaries is equal to the boundaries of the area depicted in FIG. 2, except that instead of one junction area, the area contains a multiplicity of junctions 6 which are interconnected about the periphery and to a current source 7. The light emitted from the total area was at least 200 percent greater than that emitted from a light area illustrated in FIG. 2.

When the current required to achieve a certain brightness in a light emitting diode operated dc is compared to the average current required to achieve the same brightness with a pulsed diode and if a number of data points for the two diodes recorded by setting the current in each to obtain equal brightness, and if the input average pulse current is plotted against the direct current, a curve with slope equal to unity is obtained if the perceived brightness is the same when produced by direct current or an equivalent average pulse current. However, when there is a visual enhancement factor in perceived brightness for the pulsed light, a curve with a slope less than unity is obtained. The effect can quantitatively be described by the ratios of $$\text{E. F. (Enhancement Factor)} = I_{dc}/\bar{i}_{pulse}$$

Pulsewidths from 20 nanoseconds to 1.25 milliseconds at duty factors of 1 percent and 5 percent were used for these experiments. In general, the average pulse current required to achieve a matched brightness was lower than the direct current by a factor of 2–5 and the enhancement factor was inversely proportional to the duty factor. At a 5 percent duty factor for $\tau p = 20 \times 10^{-9}$ seconds, it actually required more average pulse current to match the brightness of the dc light emitting diode. The effect was also observed by comparing the measured dc light output with the pulsed light output to eliminate the possibility of any psychophysical effects. The enhancement factor decreases with increasing duty factor ($PRF = 10^3$) and is in agreement with the brightness matching tests. Thus, the effect is an intrinsic device effect and not a psychophysical effect. As described above, the dc efficiency is low at low current density and increases to a maximum value as the current density is increased. This is also true for the pulsed case and is the reason for the observed enhancement factor. At low duty factor, the peak current of the pulsed device is at or near the maximum efficiency while the dc device is operated at a low efficiency. Therefore, it requires less average pulse current to achieve the same brightness as that produced by dc.

The brightness enhancement for pulsed light emitting diodes is due to higher external quantum efficiency at increased current levels and is not due to the psychophysical effects of the human eye. It has been shown that it requires more average pulse current than direct current when the pulsewidth is sufficiently short even at a low duty factor. Also, the enhancement factor decreases as the light emitting diodes are brightness matched at increasing current levels until there is no enhancement even at low duty factor when $I_{dc}$ is such that the external quantum efficiency is at its maximum value.

The enhancement effect is due to the intrinsic characteristics of the external quantum efficiency for semiconductor material used in making the light emitting PN junction.

The efficiency of GaAsP devices made from typical wafers is shown in FIG. 1. This efficiency is calculated from the power output measurements of the devices as a function of input injection current. While the absolute values are slightly different, the general shape of the efficiency curve as a function of injection level is consistent. This is also true for the pulsed mode operation of the devices. The efficiency curve behaves similarly to the dc efficiency curve in that it rises rapidly at low injection levels, saturates at some peak value, and then decreases at higher levels.

In accordance with this invention, a given area of light emission from a PN junction area is made significantly more efficient provided the area is segmented or composed of a multiplicity of light emitting source junctions interconnected in a manner so as not to block or cover the area of maximum current density and in turn maximum brightness. The result is a device with more improved brightness uniformity.

Light emitting diode devices can be maximized for efficiency in accordance with this invention by significantly decreasing the light emitting active area of a given single junction area. This procedure does not decrease the overall light emitting boundary but the planar doped or impurity area embodies a multiplicity of discrete light emitting areas closely spaced and electrically interconnected so that upon forward biasing the light emission perceived by the human eye will not resolve segmented or discrete areas within the boundary of the light emitting areas. Each light emitting element is electrically contacted on its periphery and interconnected with the other elements in a given area. The shape of the individual light emitting aras is not limiting and convenient geometry or shape is within the purview of the invention. A specific example of such a device is illustrated in FIG. 3.

Current can be dc or pulsed. In dc operation, for example, light emitting elements were part of 5 × 7 monolithic array structure and each element in the array was 0.007 × 0.007" individually addressed by external electronics. The current injection was 1 milliamp which when superimposed upon the curve of FIG. 1 falls within the lower efficiency area. When such an element is broken up into discrete segments as shown in FIG. 3 and utilizing the same current factor, the current density is increased by a factor 3 and the efficiency is approximately seven times greater.

Any suitable method or technique may be used to segment or construct a light emitting area into a multiplicity of discrete PN junction areas. The structure or geometry of a particular area will vary with and depend upon the intended specific application of the diode area. For example, when light emitting diodes are used for numeric indicators, the design of the light emitting area is a seven segment array of light emitting regions each of which is addressed by means of a connection to the chip. This structure is achieved by using high resolution photolithographic masking techniques.

A photoresist layer is placed over a protective diffusion mask of *rf* sputtered $Al_2O_3$ which is deposited onto a gallium arsenide phosphide layer prior to the photoresist operation. The desired pattern which is to be the diffused region is deposited upon the $Al_2O_3$ and holes are etched into the aluminum oxide. A zinc diffusion is then carried out in a closed capsule at about 650°C for one hour in order to form the appropriate PN junction, usually to a depth of about two microns.

After diffusions have been formed, an *n* contact such as silver-tellurium is alloyed into the n region of the gallium arsenide phosphide layer. A *P*-contact is formed by allowing silver-zinc in contact with the diffused region and finally all diffused regions are connected together by means of an aluminum interconnection bus bar. The spacing between the individual diffused regions is equal to or less than that which can be resolved by the human eye. Therefore, the active area made up of many discrete segments or light emitting diodes appears as a single light emitting region over the entire area comprising the light emitting diode segment.

The human eye can resolve lines separated by a visual angle 0.3 milliradian. For example, in light emitting seiconductors, if the elements are spaced about 0.0018 inch they will not be resolved at a viewing distance greater than one foot. Therefore, spacing light emitting segments in accordance with this invention should be no greater than 1.8 mils.

Upon the application of maximum available injection current, the current density in the segment is substantially higher than if the entire area was a single diffusion. Consequently, the active area can easily be decreased to about 30 percent of the total segment area in order to obtain significantly higher current density and therefore greatly increased efficiency which results in a reduction in the amount of injection current. The contacts to such devices or discrete areas may be arranged so that the perimeter of each discrete element is surrounded by the contact area. The contact region is significantly smaller than in the conventional prior art light emitting diode and the distance to the most distant point in the specific element is the same from each edge of the contact which makes the brightness more uniform because of more uniform injection current.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. In a light emitting diode comprising a continuous active region being defined by area A located on a semiconductor substrate, said continuous active region defined by said area A and said semiconductor substrate constituting a continuous PN junction, a contact means connected to said continuous active region for receiving a current I for biasing said light emitting diode to a light emitting state, said continuous PN region defined by said area A being responsive to said current I for generating a maximum current density $J$, where $J = I/A$, the improvement comprising:

a. a plurality of inactive regions disposed and located within said area $A$ for forming a plurality of spaced separated active subregions, the total combined area of each of said active subregions being equal to $A'$, said area $A'$ being less than said area $A$ by a factor $N$, where $NA' = A$, b. each of said active subregions being connected to said contact means for receiving said current $I$, each of said active subregions being cumulatively responsive to said current $I$ for generating a current density $J'$, where $J' = I/A'$ or $J' = NJ$, thus improving the quantum efficiency of said light emitting diode.

2. In a light emitting diode comprising a continuous active region being defined by area $A$ located on a semiconductor substrate, said continuous active region defined by said area $A$ and said semiconductor substrate constituting a continuous PN junction, a contact means connected to said continuous active region for receiving a current $I$ for biasing said light emitting diode to a light emitting state, said continuous PN region defined by said area A being responsive to said current $I$ for generating maximum current density $J$, where $J = I/A$, the improvement as in claim 1 wherein:

a. said plurality of inactive regions are disposed a predetermined distance from each other and are not resolved by the human eye and therefore generates a continuous solid visible light pattern to the human eye over said entire area $A$ during energization of said active subregions by said current $I$.

3. In a light emitting diode comprising a continuous active region being defined by area $A$ located on a semiconductor substrate, said continuous active region defined by said area $A$ and said semiconductor substrate constituting a continuous PN junction, a contact means connected to said continuous active region for receiving a current $I$ for biasing said light emitting diode to a light emitting state, said continuous PN region defined by said area $A$ being responsive to said current $I$ for generating maximum current density $J$, where $J = I/A$, the improvement as in claim 1 wherein:

a. said contact means comprise a segmented grid having a plurality of apertures therein, each perimeter of respective ones of said plurality of apertures being connected to the periphery of respective ones of said active subregions.

4. In a light emitting diode comprising a continuous active region being defined by area A located on a semiconductor substrate, said continuous active region defined by said area $A$ and said semiconductor substrate constituting a continuous PN junction, a contact means connected to said continuous active region for receiving a current $I$ for biasing said light emitting diode to a light emitting state, said continuous PN region defined by said area A being responsive to said current $I$ for generating maximum current density $J$, where $J = I/A$, the improvement as in claim 3 wherein:

a. said semiconductor substrate is a material selected from the group consisting of gallium arsenide phosphide, gallium aluminum arsenide, gallium phosphide, gallium nitride, aluminum arsenide, aluminum phosphide and aluminum nitride.

5. In a light emitting diode comprising a continuous active region being defined by area A located on a semiconductor substrate, said continuous active region defined by said area $A$ and said semiconductor substrate constituting a continuous PN junction, a contact means connected to said continuous active region for receiving a current $I$ for biasing said light emitting diode to a light emitting state, said continuous PN region defined by said area $A$ being responsive to said current $I$ for generating maximum current density $J$, where $J = I/A$, the improvement as in claim 4 wherein:

a. said semiconductor substrate comprises an N type material and each of said active subregions comprise a P type material.

* * * * *